US005590211A

United States Patent [19]

Chang

[11] Patent Number: 5,590,211

[45] Date of Patent: Dec. 31, 1996

[54] MICROPHONE

[76] Inventor: Ching-Lu Chang, No. 39, Lane 29, Shih-Chia Rd., Tung Dist., Taichung City, Taiwan

[21] Appl. No.: 502,070

[22] Filed: Jul. 14, 1995

[51] Int. Cl.[6] .............................. H04R 25/00; H04R 7/00; H05K 5/00

[52] U.S. Cl. .......................... 381/193; 381/202; 381/199; 181/158; 181/165

[58] Field of Search .................................... 381/193, 168, 381/169, 177, 188, 205, 199, 202; 181/164, 157, 168, 169, 165

[56] References Cited

U.S. PATENT DOCUMENTS 4,709,392 11/1987 Kato et al. .............................. 381/193

*Primary Examiner*—Sinh Tran
*Attorney, Agent, or Firm*—Harness, Dickey & Pierce, P.L.C.

[57] ABSTRACT

A microphone includes a voice coil, a membrane and a diaphragm that has an annular convex portion encircling a central convex portion and a concentric cutout portion on the central convex portion. The membrane covers the cutout portion and extends to the periphery of the central convex portion. The combination of a properly designed cutout portion, the thickness of the membrane, the materials used for the membrane and the diaphragm, and the adhesive method employed to connect the membrane and the diaphragm shall result in a microphone that is capable of delivering high quality sound.

4 Claims, 3 Drawing Sheets

MICROPHONE

BACKGROUND OF THE INVENTION

1. Field of the Invention

The invention relates to a microphone, more specifically to a microphone with an improved diaphragm that increases the sensitivity and responsiveness of the microphone.

2. Description of the Related Art

Microphones can be divided into several categories depending on the transducer principle used. The dynamic microphone is a popular conventional microphone and comprises a magnet which has opposite poles and which is mounted inside a housing, a voice coil which is disposed movably in a magnetic field between the opposite poles of the magnet, and a diaphragm which is attached to the upper end of the voice coil and which is spread over the cross section of the housing.

In the dynamic microphone, the compression and rarefaction of sound waves actuate the diaphragm, thus causing movements in the attached voice coil and creating a varying magnetic flux. This varying flux, together with the magnetic field generated by the magnet, produces electrical signals which are provided to an amplifier and then to a speaker.

FIG. 1 shows a light and flexible conventional diaphragm 10 that comprises a central convex portion 11, an annular convex portion 12 encircling the central convex portion 11, the juncture of the convex portions 11, 12 being attached to a voice coil 13 located below, a plurality of ribs 14 on the surface of the annular convex portion 12, and a flat periphery 15. Different portions of the diaphragm 10 respond to different frequency ranges. The central convex portion 11 responds to a high frequency range, the ribs 14 respond to a mid-frequency range, and the annular convex portion 12 responds to a low frequency range. The quality of the broadcast sound depends upon the flexibility and lightness of the components. In a high quality microphone, the high frequency range responding component is rigid and light, while the low frequency range responding component is flexible. However, all of the components of the conventional diaphragm 10 are made of the same material. They all have the same thickness and rigidity. Thus, a microphone which uses the diaphragm 10 is unable to deliver high quality sounds.

Another type of conventional diaphragm 20, as shown in FIG. 2, comprises a flat periphery 213, an annular convex portion 212, a central convex portion 211, and a membrane 22 of equivalent size as the central convex portion 211 and covering the central convex portion 211. The addition of the membrane 22 increases the rigidity required in the high frequency range. However, the membrane 22 is attached back-to-back with the central convex portion 211 by an adhesive. Such adhering method increases the weight of the diaphragm 20, thereby resulting in an adverse effect on the sound quality.

SUMMARY OF THE INVENTION

Therefore, the object of this invention is to provide a microphone with an improved diaphragm that permits the production of high quality sound.

Accordingly, the microphone of the present invention comprises a housing having an opening on an upper end thereof, a magnet with opposite poles mounted inside the opening, a voice coil disposed movably in a magnetic field generated between the opposite poles of the magnet, a diaphragm attached to the voice coil, and a membrane. The membrane covers the diaphragm, and is attached to a peripheral edge of the diaphragm. The diaphragm has a central convex portion dimensionally matching the perimeter of the voice coil, a concentric cutout portion on an apex of the central convex portion, and an annular convex portion encircling the central convex portion and forming an annular juncture. The annular juncture is attached to the voice coil at an upper circumferential end of the voice coil so the voice coil will move in the magnetic field by virtue of movement of the diaphragm in response to compression and rarefaction of sound waves.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENTS

Figure 1:
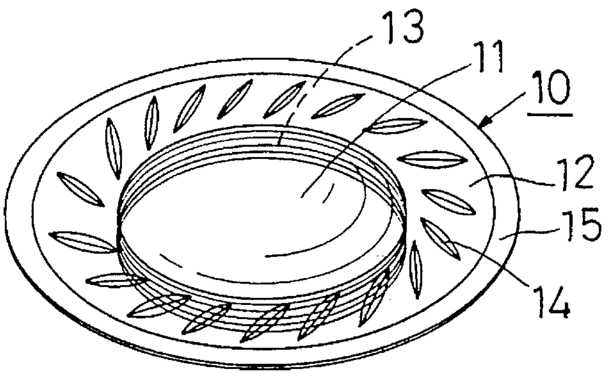
FIG.1 PRIOR ART
FIG. 1 is a perspective view of a first type of conventional diaphragm used in a microphone.
Figure 2:
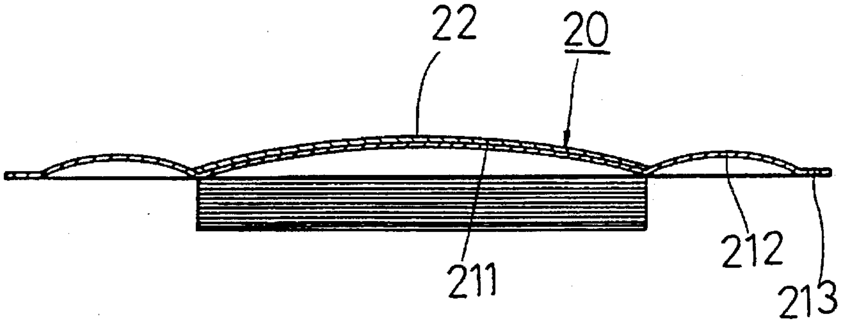
FIG.2 PRIOR ART
FIG. 2 is a sectional view showing another type of conventional diaphragm used in a microphone.
Figure 3:
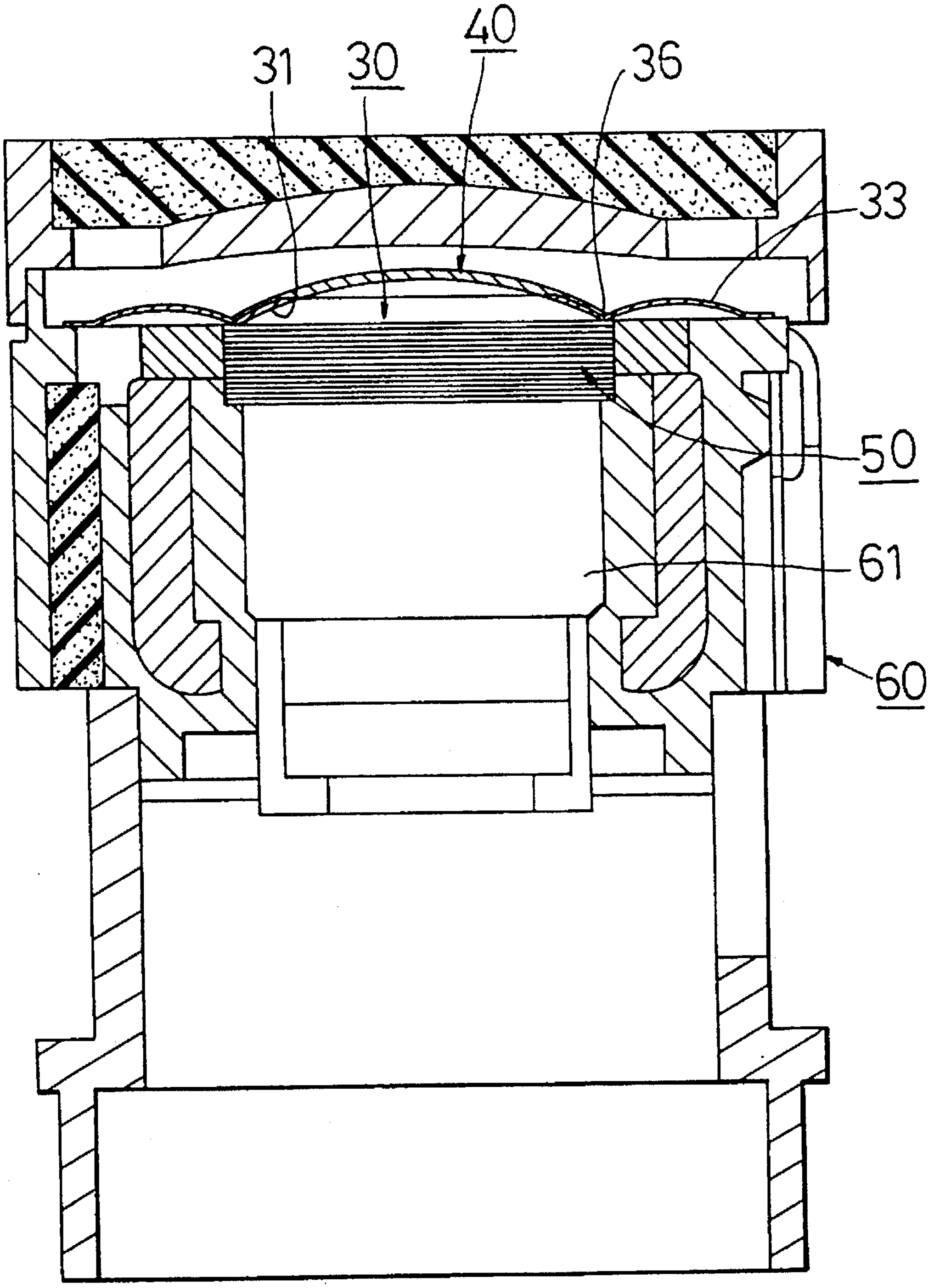
FIG. 3 is a schematic sectional view of the preferred embodiment of a microphone according to the present invention.

Referring to FIG. 3, the preferred embodiment of a microphone of the present invention is shown to comprise a housing 60, a magnet 61 mounted inside an opening formed on an upper end of the housing 60, a voice coil 50 disposed movably in a magnetic field generated between opposite poles of the magnet 61, a diaphragm 30 spread over the cross section of the housing 60 and attached to the upper end of the housing 60 at the periphery 35 thereof, the diaphragm 30 being further attached to the top of the voice coil 50, and a membrane 40 covering the central convex portion 31 of the diaphragm 30.

Figure 4:
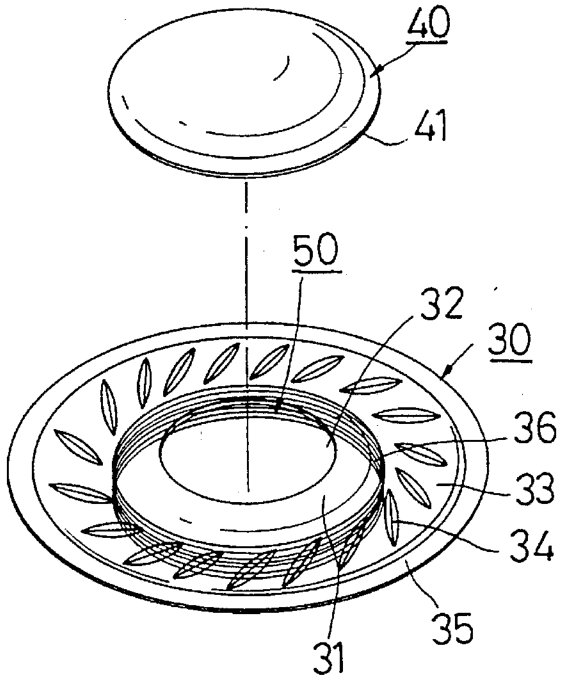
FIG. 4 is an exploded perspective view of the diaphragm of the preferred embodiment.
Figure 5:
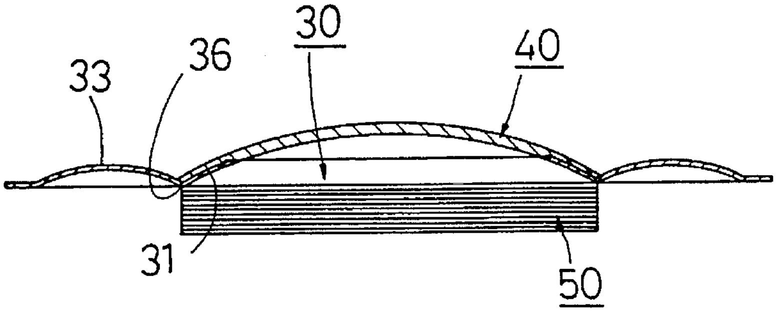
FIG. 5 is a sectional view showing the diaphragm of the preferred embodiment.

FIG. 4 and 5 show the diaphragm 30, the membrane 40 and the voice coil 50 in greater detail. The diaphragm 30 has an annular convex portion 33 that encircles a central convex portion 31, a concentric cutout portion 32 on an apex of the central convex portion 31, and a plurality of ribs 34 on the surface of the annular convex portion 33. The cutout portion 32 compensates for the weight of the membrane 40 that is applied to the diaphragm 30. Thus, the size of the cutout portion 32 depends upon the materials used for the diaphragm 30 and the membrane 40, and the degree of desired high frequency sensitivity.

The membrane 40, which is equivalent in size as the central convex portion 31, covers the cutout portion 32 and extends to a peripheral edge of the central convex portion 31. The membrane 40 is made of a rigid yet light material, such as Mylar or an aluminum alloy, and its thickness is determined by the desired responsiveness to the high frequency range.

A juncture 36 between the central convex portion 31 and the annular convex portion 33 is attached to the top periphery of the voice coil 50. The membrane 40 has a periphery 41 which is also connected to the central convex portion 31 at the juncture 36 by known adhesive methods.

In order for the microphone to deliver high quality sound, the central convex portion 31 of the diaphragm 30 is covered by the membrane 40, which has a predesignated thickness and which is made of a more rigid but lighter material than the diaphragm 30. The central convex portion 31 thus meets the rigid and light requirements of the high frequency range, while the encircling annular convex portion 33 retains the flexibility that is needed at the low frequency range. Such design enables the diaphragm 30 to be highly responsive to all frequency ranges. Moreover, the membrane 40 and the diaphragm 30 are connected only at the juncture 36. Thus, the addition of the membrane 40 increases the rigidity of the central convex portion 31 but will not greatly increase the weight applied on the diaphragm 30 due to the aforementioned connection. Furthermore, the size of the cutout portion 32 of the diaphragm 30 also serves to compensate for the increase in weight due to the presence of the membrane 40.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A microphone comprising:

a housing having an opening on an upper end thereof;

a magnet mounted inside said opening and having two opposite poles, said magnet generating a magnetic field between said opposite poles;

a voice coil disposed movably in said magnetic field;

a diaphragm spread over said opening and attached to said upper end of said housing at a peripheral portion thereof, said diaphragm having a central convex portion dimensionally matching perimeter of said voice coil, said central convex portion having a concentric cutout portion, said diaphragm further having an annular convex portion encircling said central convex portion and forming an annular juncture with said central convex portion, said annular juncture being attached to said voice coil so that said voice coil will move in said magnetic field by virtue of movement of said diaphragm in response to compression and rarefaction of sound waves; and a membrane made of a material more rigid than said diaphragm, said membrane covering said cutout portion and extending to said annular juncture, said membrane being connected to said central convex portion only at said annular juncture.

2. A microphone as claimed in claim 1, wherein said membrane is made of Mylar.

3. A microphone as claimed in claim 1, wherein said membrane is made of an aluminum alloy.

4. A microphone as claimed in claim 1, wherein said annular convex portion has a plurality of ribs located on a surface thereof.

* * * * *